United States Patent
Zanetta et al.

(10) Patent No.: US 9,148,056 B2
(45) Date of Patent: Sep. 29, 2015

(54) VOLTAGE REGULATION SYSTEM FOR INTEGRATED CIRCUIT

(71) Applicants: Pedro Barbosa Zanetta, Campinas (BR); Kumar Abhishek, Ghaziabad (IN); Sunny Gupta, Noida (IN); Nitin Pant, New Delhi (IN)

(72) Inventors: Pedro Barbosa Zanetta, Campinas (BR); Kumar Abhishek, Ghaziabad (IN); Sunny Gupta, Noida (IN); Nitin Pant, New Delhi (IN)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 163 days.

(21) Appl. No.: 14/150,725

(22) Filed: Jan. 8, 2014

(65) Prior Publication Data

US 2015/0194886 A1 Jul. 9, 2015

(51) Int. Cl.
G05F 1/569 (2006.01)
H02M 3/158 (2006.01)
G05F 1/565 (2006.01)
G05F 1/571 (2006.01)
G05F 1/573 (2006.01)
H03K 19/00 (2006.01)
H02M 1/00 (2007.01)

(52) U.S. Cl.
CPC ............. H02M 3/158 (2013.01); G05F 1/565 (2013.01); G05F 1/569 (2013.01); G05F 1/571 (2013.01); G05F 1/573 (2013.01); H03K 19/0013 (2013.01); H02M 2001/0032 (2013.01)

(58) Field of Classification Search
CPC ......... G05F 1/565; G05F 1/569; G05F 1/571; G05F 1/573
See application file for complete search history.

(56) References Cited

U.S. PATENT DOCUMENTS

| | | | |
|---|---|---|---|
| 5,550,494 A * | 8/1996 | Sawada | 327/69 |
| 6,671,816 B1 | 12/2003 | Woo | |
| 6,766,222 B1 | 7/2004 | Duley | |
| 7,202,653 B2 * | 4/2007 | Pai | 323/284 |
| 7,376,847 B2 | 5/2008 | Chen | |
| 7,512,010 B2 * | 3/2009 | Cho et al. | 365/185.23 |
| 7,626,368 B2 * | 12/2009 | Novak | 323/275 |
| 7,739,528 B2 | 6/2010 | Zhuang | |
| 7,770,037 B2 | 8/2010 | Searles | |
| 8,013,473 B2 * | 9/2011 | Frew et al. | 307/87 |
| 8,018,093 B2 * | 9/2011 | Miermont et al. | 307/80 |
| 8,149,644 B2 * | 4/2012 | Fujioka et al. | 365/233.1 |
| 8,164,378 B2 | 4/2012 | Pietri | |
| 8,279,646 B1 | 10/2012 | Hamstra | |
| 8,400,014 B2 * | 3/2013 | Li et al. | 307/48 |
| 8,653,884 B2 * | 2/2014 | Miwa et al. | 327/538 |
| 2007/0046106 A1 * | 3/2007 | Shintomi | 307/64 |
| 2014/0210550 A1 * | 7/2014 | Mathe et al. | 330/131 |
| 2015/0160668 A1 * | 6/2015 | Pujol et al. | G05F 1/575 |
| 2015/0162055 A1 * | 6/2015 | Yoo et al. | G11C 5/147 |

* cited by examiner

*Primary Examiner* — Thomas J Hiltunen
(74) *Attorney, Agent, or Firm* — Charles Bergere (57) ABSTRACT

An integrated circuit (IC) with voltage regulation includes high power and low power domains, low and high voltage regulators and a low power regulator. The low voltage regulator powers the high and low power domains when the IC is in a HIGH power mode. The low power regulator receives a voltage from a high voltage regulator and powers the low power domain when the IC is in a LOW power mode. The IC includes a switching module that disconnects the low voltage regulator from the low power domain when the output voltage of the high voltage regulator is lower than a threshold voltage during power-up and connects the low voltage regulator to the low power domain when the voltage regulated by the high voltage regulator exceeds the threshold voltage.

20 Claims, 3 Drawing Sheets

VOLTAGE REGULATION SYSTEM FOR INTEGRATED CIRCUIT

BACKGROUND OF THE INVENTION

The present invention relates generally to integrated circuits, and, more particularly, to a voltage regulation system for an integrated circuit.

Many integrated circuits (ICs) today including system-on-chips (SoCs) integrate various digital and analog components on a single chip. Such ICs also include different power domains including high and low power domains. The high power domain includes components that operate when the IC is in a HIGH power mode and are powered down when the IC is in a LOW power mode. The low power domain includes components that operate when the IC is in the HIGH and LOW power modes. ICs with multiple power domains require multiple power supplies that are served by voltage regulators. The voltage regulators provide different voltages to the components in the high and low power domains based on the IC mode of operation.

Figure 1:
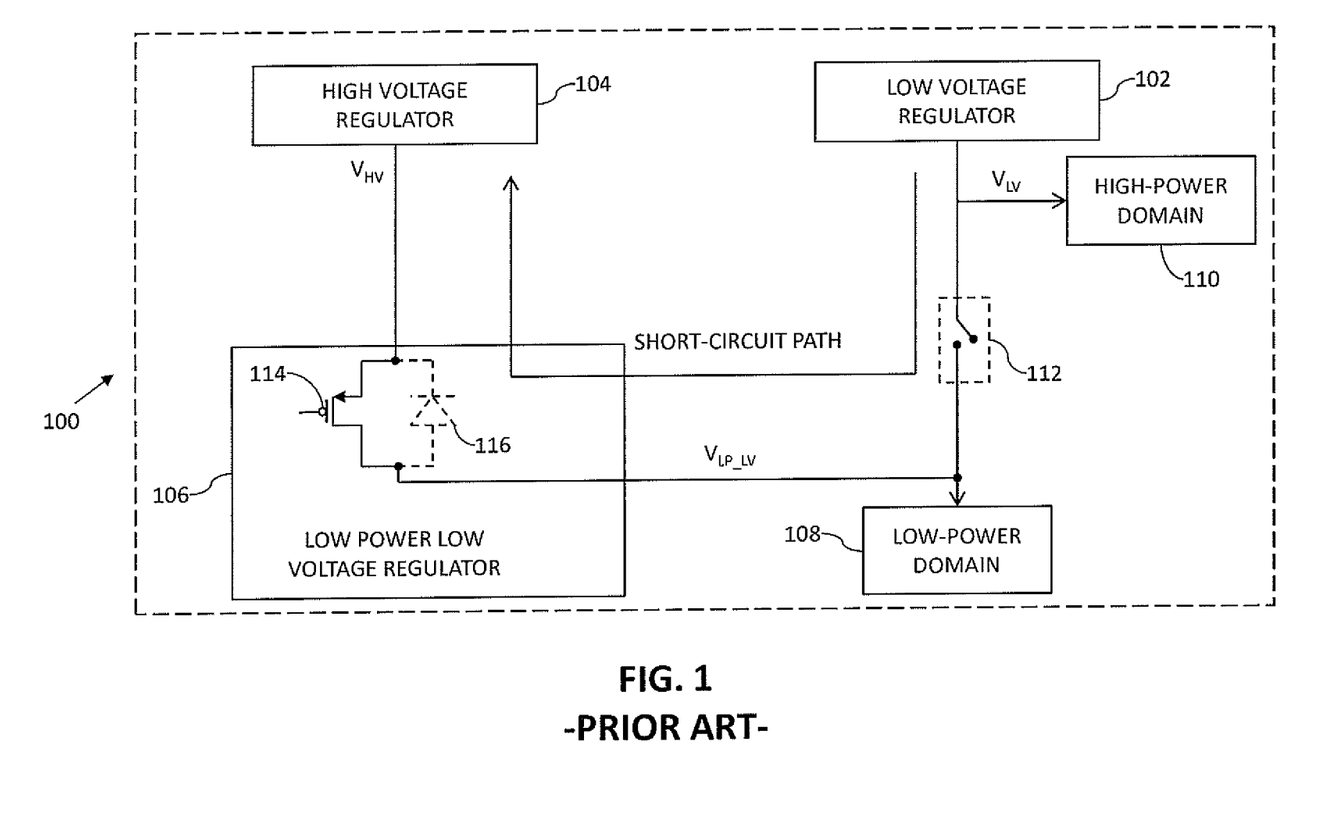
FIG. 1 is a simplified schematic block diagram of a conventional integrated circuit.

FIG. 1 is a schematic block diagram of a conventional integrated circuit (IC) 100 that is operable in both HIGH and LOW power modes and includes a low voltage regulator 102 (hereinafter "LV regulator"), a high voltage regulator 104 (hereinafter "HV regulator"), a low power low voltage regulator 106 (hereinafter "LP_LV regulator"), a low power domain 108, a high power domain 110, and a switch 112. The LV and HV regulators 102 and 104 are connected to an external power supply (not shown). The switch 112 is connected between the LV regulator 102 and the low power domain 108. The LV regulator 102 provides a first regulated voltage $V_{LV}$ to both the low and high power domains 108 and 110 when the IC 100 is in the HIGH power mode and is switched off when the IC 100 is in the LOW power mode. The HV regulator 104 generates a second regulated voltage $V_{HV}$ when the IC 100 is in either of the HIGH or LOW power modes. The LP_LV regulator 106 receives the second regulated voltage $V_{HV}$ and provides a third regulated voltage $V_{LP\_LV}$ to the low power domain 108 when the IC 100 is in the LOW power mode. The LP_LV regulator 106 is an internal low power regulator implemented using a p-type, metal-oxide semiconductor (PMOS) transistor 114 having its source and body terminals connected together. An intrinsic diode 116 is formed between the drain and source or body terminals of the PMOS transistor 114. In order to avoid undesirable circuit behavior, the intrinsic diode 116 is usually kept reverse biased (e.g., $V_{LP\_LV} < V_{HV}$).

The low power domain 108 functions in both the HIGH and LOW power modes, while the high power domain 110 functions in the HIGH power mode and is powered down in the LOW power mode. The switch 112 is closed when the IC 100 is in the HIGH power mode, which allows the LV regulator 102 to provide the first regulated voltage $V_{LV}$ to the low power domain 108.

In both the HIGH and LOW power modes, the first regulated voltage $V_{LV}$ is lower than the second regulated voltage $V_{HV}$. Therefore, the intrinsic diode 116 is reverse biased because its body terminal is at a higher potential than its drain terminal. However, conditions such as power-on-reset (POR), sudden failure, and accidental resets may cause the IC 100 to reset, causing the IC 100 to power-on and transition to the HIGH power mode (referred to as power-up). During power-up, the output voltage of the LV regulator 102 may reach a steady-state voltage level before the output voltage of the HV regulator 104. Therefore, the output voltage of the LV regulator 102 may be higher than the output voltage of the HV regulator 104 for a transient period. Since the switch 112 is closed during power-up, the intrinsic diode 116 in the LP_LV regulator 106 is forward biased, causing a short-circuit path between the LV and HV regulators 102 and 104, by way of the switch 112 and the LP_LV regulator 106. When such a condition occurs, a high supply current is drawn from the LV regulator 102, which can damage some internal components of the IC 100.

One technique to overcome the aforementioned problem is to employ a specific power sequence. Power sequencing controls the order in which the LV and HV regulators 102 and 104 are powered up or down. However, power sequencing is not always desirable because it requires complex applications to prevent the aforementioned problem. Another known technique entails applying a high voltage to a well region of the PMOS transistor 114, which renders the intrinsic diode 116 non-conductive and thus prevents the short-circuit path. However, applying this high voltage increases power consumption of the IC 100.

Therefore, it would be advantageous to have a voltage regulating system in an integrated circuit that avoids damaging internal components of the integrated circuit caused by the aforementioned problem.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION OF THE PRESENT INVENTION

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

In an embodiment of the present invention, an integrated circuit (IC) capable of operating in HIGH and LOW power modes is provided. The IC includes low and high power domains, first, second and third voltage regulators, and a switching module. The first voltage regulator regulates a voltage provided to the low and high power domains at a first voltage level when the IC is in the HIGH power mode and is switched off when the IC is in the LOW power mode. The second voltage regulator generates a voltage that is regulated at a second voltage level and operates when the IC is in either the HIGH or LOW power modes. The third voltage regulator is connected between the second voltage regulator and the low power domain. The third voltage regulator receives the voltage regulated by the second voltage regulator and regulates a voltage provided to the low power domain at a third voltage level when the IC is in the LOW power mode and is switched off when the IC is in the HIGH power mode. The switching module is connected to the second voltage regulator, and between the first voltage regulator and the low power domain. The switching module receives and compares the voltage regulated by the second voltage regulator with a threshold voltage, and connects the first voltage regulator to the low power domain when the voltage regulated by the second voltage regulator exceeds the threshold voltage.

In another embodiment of the present invention, an integrated circuit includes low and high power domains, first, second and third voltage regulators, a voltage monitor module, a safe-state module, and a power switch module. The IC is capable of operating in HIGH and LOW power modes. The first voltage regulator regulates a voltage provided to the low and high power domains at a first voltage level when the IC is in the HIGH power mode and is switched off when the IC is in the LOW power mode. The second voltage regulator generates a voltage that is regulated at a second voltage level and operates when the IC is in the HIGH and LOW power modes. The third voltage regulator is connected between the second voltage regulator and the low power domain. The third voltage regulator receives the voltage regulated by the second voltage regulator and regulates a voltage provided to the low power domain at a third voltage level when the IC is in the LOW power mode, and is switched off when the IC is in the HIGH power mode. The voltage monitor module is connected to the second voltage regulator and receives and compares the voltage regulated by the second voltage regulator with a threshold voltage and generates a voltage monitor signal when the voltage regulated by the second voltage regulator exceeds the threshold voltage. The safe-state module is connected to the voltage monitor module and receives the voltage monitor signal, a first control signal, and a selected voltage level, and generates a safe-state signal. The power-switch module is connected to the safe-state module and between the first voltage regulator and the low power domain. The power-switch module connects the first voltage regulator to the low power domain based on the safe-state signal.

In yet another embodiment of the present invention, an integrated circuit is provided that includes low and high power domains, first, second and third voltage regulators, first and second comparators, a first logic gate, a level-shifter, a first logic circuit, an n-channel metal oxide semiconductor (NMOS) transistor, a first transistor, and a supply selector module. The IC is capable of operating in HIGH and LOW power modes. The first voltage regulator regulates a voltage provided to the low and high power domains at a first voltage level when the IC is in the HIGH power mode and is switched off when the IC is in the LOW power mode. The second voltage regulator generates a voltage that is regulated at a second voltage level and operates when the IC is in the HIGH and LOW power modes. The third voltage regulator is connected between the second voltage regulator and the low power domain. The third voltage regulator receives the voltage regulated by the second voltage regulator and regulates a voltage provided to the low power domain at a third voltage level in the LOW power mode and is switched off in the HIGH power mode. The first comparator receives a first threshold voltage and the voltage regulated by the second voltage regulator and generates a first voltage monitor signal when the voltage regulated by the second voltage regulator exceeds the first threshold voltage. The second comparator receives a second threshold voltage and a first node voltage obtained at a node between the low power domain and the third voltage regulator, and generates a second voltage monitor signal when the first node voltage exceeds the second threshold voltage. The level-shifter is connected to the low power domain, and receives a reference signal and level shifts a voltage level of the reference signal from the third voltage level to the second voltage level. The first logic gate receives the second voltage monitor signal and the level-shifted reference signal and generates a first control signal. The first logic circuit receives the first voltage monitor signal and the first control signal and generates a second control signal. The NMOS transistor has a source terminal connected to ground and a body terminal connected to its the source terminal. A gate terminal of the NMOS transistor is connected to the first logic circuit for receiving the second control signal and generating a safe-state signal at its drain terminal. The first transistor has a source terminal connected to the first voltage regulator, a drain terminal connected to the low power domain, and a gate terminal connected to the drain terminal of the NMOS transistor. The first transistor receives the safe-state signal at its gate terminal from the drain terminal of the NMOS transistor, and connects the first voltage regulator to the low power domain based on the safe-state signal. The supply selector module is connected to the source and drain terminals of the first transistor, and selects and provides a higher one of the voltages at the source and drains terminals of the first transistor as the selected voltage to the drain terminal of the NMOS transistor by way of a pull-up resistor and the body terminal of the first transistor.

Various embodiments of the present invention provide a system for regulating voltage in an IC. The IC includes low and high power domains, first, second and third voltage regulators, and a switching module. The IC is capable of operating in HIGH and LOW power modes. The first voltage regulator is a low voltage regulator and regulates a voltage provided to the low power and high power domains at a first voltage level in the HIGH power mode and is switched off in the LOW power mode. The second voltage regulator is a high voltage regulator and generates a voltage that is regulated at a second voltage level, greater than the first voltage level, and operates in the HIGH and LOW power modes. The third voltage regulator receives the voltage regulated by the high voltage regulator and regulates a voltage provided to the low power domain at a third voltage level in the LOW power mode and is switched off in the HIGH power mode. During conditions such as power-on-reset (POR), sudden failure, and accidental resets, the IC resets and powers-on and transitions to the HIGH power mode (known as power-up). During power-up, the voltage regulated by the low voltage regulator may ramp up faster than the voltage regulated by the high voltage regulator. When this occurs, the output voltage level of the low voltage regulator is higher than that of the high voltage regulator for a brief time period until the voltage regulated by the high voltage regulator exceeds the voltage regulated by the low voltage regulator. The switching module receives and compares the voltage regulated by the high voltage regulator with a threshold voltage that is substantially equal to the first voltage level. When the output voltage of the high voltage regulator is less than the threshold voltage, the switching module disconnects the low voltage regulator from the low power domain and prevents an intrinsic diode of the third voltage regulator from being forward biased. This technique consumes less power than conventional techniques. When the voltage regulated by the high voltage regulator exceeds the threshold voltage, the switching module connects the low voltage regulator to the low power domain.

Figure 2:
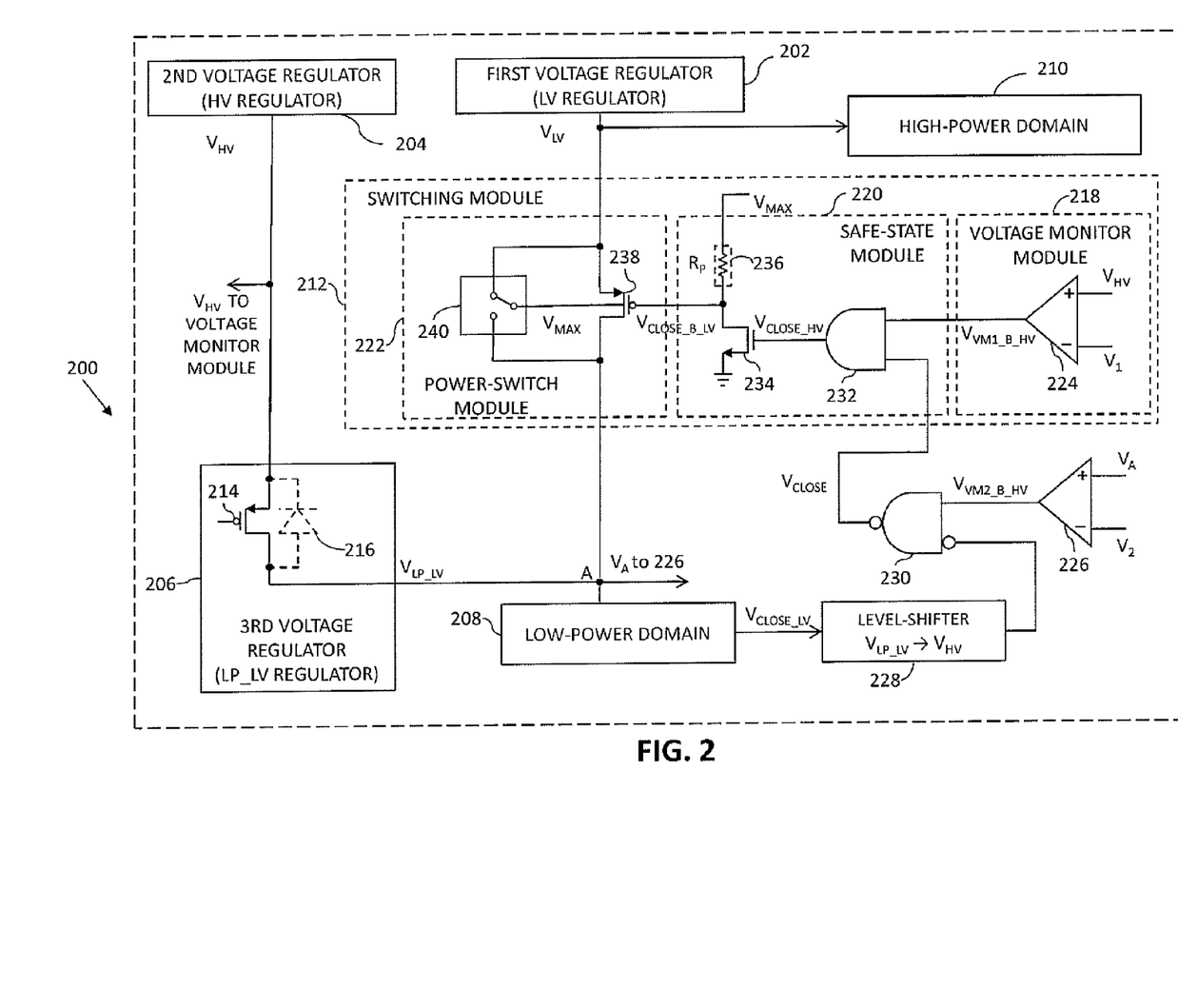
FIG. 2 is a schematic block diagram of an integrated circuit in accordance with an embodiment of the present invention.

Referring now to FIG. 2, a schematic block diagram of an integrated circuit (IC) 200 in accordance with an embodiment of the present invention is shown. The IC 200 includes a first voltage regulator 202 (hereinafter low voltage or LV regulator), a second voltage regulator 204 (hereinafter high voltage or HV regulator), a third voltage regulator 206 (hereinafter low power or LP_LV regulator"), low and high power domains 208 and 210, and a switching module 212. The LP_LV regulator 206 is a low power regulator including a PMOS transistor 214 having its source and body terminals connected together. An intrinsic diode 216 is formed between the drain and body terminals of the PMOS transistor 214. In order to avoid undesirable circuit behavior, the intrinsic diode 216 is reverse-biased.

The IC 200 operates in HIGH and LOW power modes. In the HIGH power mode, both the low and high power domains 208 and 210 are operational, and the LV regulator 202 provides a first regulated voltage $V_{LV}$ (at a first voltage level) to the low power domain 208 by way of the switching module 212, and directly to the high power domain 210. On the other hand, in the LOW power mode, the low power domain 208 is operational and the high power domain 210 is power-gated (switched off) by switching off the LV regulator 202 and disconnecting the high power domain 210 from the low power domain 208 using the switching module 212. The HV regulator 204 generates a second regulated voltage $V_{HV}$ (at a second voltage level). The LP_LV regulator 206 receives the second regulated voltage $V_{HV}$ and generates a third regulated voltage $V_{LP\_LV}$ (at a third voltage level), which it provides to the low power domain 208. The PMOS transistor 214 has its source and body terminals connected to the HV regulator 204 and its drain terminal connected to the low power domain 208.

The switching module 212 includes a voltage monitor module 218, a safe-state module 220 and a power-switch module 222. The voltage monitor module 218 includes a first comparator 224, which has a first input terminal connected to the HV regulator 204 for receiving the output voltage of the HV regulator 204 and a second input terminal connected to a first bandgap voltage source (not shown) for receiving a first threshold voltage $V_1$. In one embodiment, the magnitude of the first threshold voltage $V_1$ is substantially equal to the first voltage level. In another embodiment, the first threshold voltage $V_1$ may be marginally lower than the first voltage level such that the difference between the first voltage level and the first threshold voltage $V_1$ is less than a turn-on voltage of the intrinsic diode 216. In yet another embodiment, the first threshold voltage $V_1$ may be greater than the first regulated voltage $V_{LV}$. For example, if the first voltage level is 1.25V and the turn-on voltage of the intrinsic diode 216 is 200 mV, i.e., 0.2V, then the magnitude of the first threshold voltage $V_1$ can be greater than 1.23V and it may attain a magnitude as high as 2.7V, which is the minimum operational value of the output voltage of the HV regulator 204.

The first comparator 224 generates a first voltage monitor signal $V_{VM1\_B\_HV}$ at its output terminal. The voltage monitor module 218 is powered by the HV regulator 204. If the HV regulator 204 is mistakenly turned OFF, i.e., when the second regulated voltage $V_{HV}$ is not available, the first voltage monitor signal $V_{VM1\_B\_HV}$ is pulled down to a ground level (logic low state). In another embodiment of the present invention, the voltage monitor module 218 may include a power-on-reset (POR) circuit.

A second comparator 226 has a first input terminal connected to a node A, which is at a junction between the low power domain 208, the LP_LV regulator 206 and the switching module 212, for receiving a first node voltage $V_A$, and a second input terminal connected to a second bandgap voltage source (not shown), for receiving a second threshold voltage $V_2$. The magnitude of the second threshold voltage $V_2$ is marginally lower than the first and third voltage levels. For example, if the first and third voltage levels are 1.25 v, then the second threshold voltage $V_2$ is about 0.9 v. The second comparator 226 generates a second voltage monitor signal $V_{VM2\_B\_HV}$ at its output terminal. A level-shifter 228 receives a reference signal $V_{CLOSE\_LV}$ from the low power domain 208 and shifts a voltage level of the reference signal $V_{CLOSE\_LV}$ from the third voltage level to the second voltage level. A first logic gate 230 has an input terminal connected to the output of the second comparator 226 for receiving the second voltage monitor signal $V_{VM2\_B\_HV}$, and an inverted input terminal connected to the output of the level-shifter 228 for receiving the level-shifted reference signal $V_{CLOSE\_LV}$. The first logic gate 230 generates a first control signal $V_{CLOSE}$ at its output terminal.

The safe-state module 220 includes a first logic circuit 232 and an NMOS transistor 234. The first logic circuit 232 has a first input terminal connected to the output terminal of the first comparator circuit 224 for receiving the first voltage monitor signal $V_{VM1\_B\_HV}$ and a second input terminal connected to the output terminal of the first logic gate 230 for receiving the first control signal $V_{CLOSE}$. The first logic circuit 232 generates a second control signal $V_{CLOSE\_HV}$ at its output terminal. The NMOS transistor 234 has a gate terminal connected to the output terminal of the first logic circuit 232 for receiving the second control signal $V_{CLOSE\_HV}$, a source terminal connected to ground, and a drain terminal connected to the power-switch module 222 as well as to a pull-up resistor 236 for receiving a selected voltage level $V_{MAX}$. The drain terminal of the NMOS transistor 234 generates a safe-state signal $V_{CLOSE\_B\_LV}$. The safe-state module 220 is powered by the HV regulator 204. If the HV regulator 204 is turned OFF accidentally, i.e., when the second regulated voltage $V_{HV}$ is not available, the second control signal $V_{CLOSE\_HV}$ is pulled down to ground level (logic low state). In an embodiment of the present invention, the first logic circuit 232 is an AND gate.

The power-switch module 222 includes a power-switch 238 and a supply selector module 240. In the present embodiment, the power-switch 238 comprises a PMOS transistor. The power-switch 238 has a gate terminal connected to the drain terminal of the NMOS transistor 234 for receiving the safe-state signal $V_{CLOSE\_B\_LV}$, a source terminal connected to the LV regulator 202, and a drain terminal connected to the low power domain 208. The supply selector module 240 is connected to the source and drain terminals of the power-switch 238. The supply selector module 240 selects and provides a higher of the voltages between the source and drain terminals of the power-switch 238 as the selected voltage level $V_{MAX}$ to the safe-state module 220 as well as to a body terminal of the power-switch 238.

Figure 3:
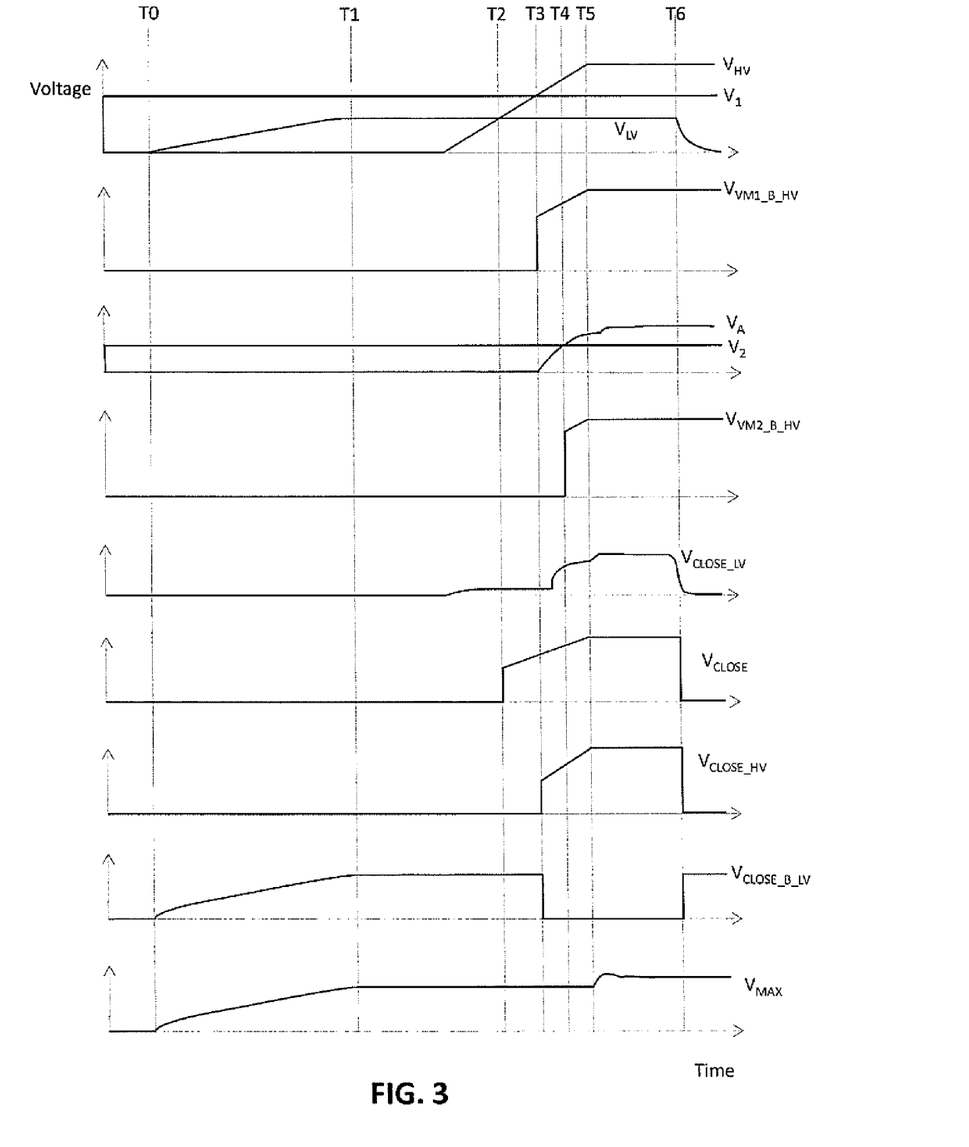
FIG. 3 shows a plurality of timing diagrams illustrating various voltage signals of the integrated circuit of FIG. 2 in accordance with an embodiment of the present invention.

FIG. 3 shows a plurality of timing diagrams illustrating the voltage regulated by the LV and HV regulators 202 and 204, the first threshold voltage $V_1$, the first voltage monitor signal $V_{VM1\_B\_HV}$, the first node voltage $V_A$, the second threshold voltage $V_2$, the second voltage monitor signal $V_{VM2\_B\_HV}$, the reference signal $V_{CLOSE\_LV}$, the first control signal $V_{CLOSE\_LV}$ the second control signal $V_{CLOSE\_HV}$, the safe-state signal $V_{CLOSE\_B\_LV}$ and the selected voltage level $V_{MAX}$. When the IC 200 is in the LOW and HIGH power modes, the intrinsic diode 216 is reverse biased. Conditions such as power-on-reset (POR), sudden failure, and accidental resets may cause the IC 200 to reset, causing the IC 200 to power-on and transition to the HIGH power mode (referred to as power-up). During power-up, both the LV and HV regulators 202 and 204 are reset. The output voltage of the LV regulator 202 starts ramping up at time T0 and reaches the first voltage level (i.e., the first regulated voltage $V_{LV}$) at time T1.

The output voltage of the HV regulator 204 starts ramping up between time T1 and T2 and reaches the second voltage level (i.e., the second regulated voltage $V_{HV}$) at time T5.

From T0 to T2, the output voltage of the LV regulator 202 is higher than the output voltage of the HV regulator 204. Until time T3, the output voltage of the HV regulator 204 is less than the first threshold voltage $V_1$. The first input terminal of the first comparator circuit 224 receives the output voltage of the HV regulator 204 and the second input terminal of the first comparator circuit 224 receives the first threshold voltage $V_1$. Since the output voltage of the HV regulator 204 is less than the first threshold voltage $V_1$ during T0 to T3, the first comparator circuit 224 generates a logic low first voltage monitor signal $V_{VM1\_B\_HV}$. The first logic circuit 232 receives the logic low first voltage monitor signal $V_{VM1\_B\_HV}$ and generates a logic low second control signal $V_{CLOSE\_HV}$ at its output terminal. Since the first voltage monitor signal $V_{VM1\_B\_HV}$ is low, the output of the first logic circuit 232 is independent of the first control signal $V_{CLOSE}$ received at the second input terminal of the first logic circuit 232. The gate terminal of the NMOS transistor 234 receives the logic low second control signal $V_{CLOSE\_HV}$. As a result, the NMOS transistor 234 is turned off its drain terminal is pulled up to the selected voltage level $V_{MAX}$ due to the pull-up resistor 232. Thus, from time T0 to T3, the second control signal $V_{CLOSE\_HV}$ is low and the safe-state signal $V_{CLOSE\_B\_LV}$ is at the selected voltage level $V_{MAX}$, as shown in FIG. 3. Since the gate terminal of the power-switch 238 receives the logic high safe-state signal $V_{CLOSE\_B\_LV}$, which is at the selected voltage level $V_{MAX}$, the drain terminal of the power-switch 238 is at high impedance. Therefore, the power-switch 238 is turned OFF (meaning the NMOS transistor is open). Thus, the LV regulator 202 is disconnected from the low power domain 208 and the LP_LV regulator 206 from time T0 to T3, and the intrinsic diode 216 remains reverse biased.

After time T3, the output voltage of the HV regulator 204 becomes higher than the first threshold voltage $V_1$, which causes the first comparator circuit 224 to generate a logic high first voltage monitor signal $V_{VM1\_B\_HV}$.

At time T3, the IC 200 starts operating in the HIGH power mode. The LP_LV regulator 206 is turned OFF when the IC 200 is powering-up and is in the HIGH power mode. Since the power-switch is open, the first node voltage $V_A$ is at ground level and thus is less than the second threshold voltage $V_2$ so the second comparator circuit 226 generates a logic low second voltage monitor signal $V_{VM2\_B\_HV}$. The first logic gate 230 receives the logic low second voltage monitor signal $V_{VM2\_B\_HV}$ and generates a logic high first control signal $V_{CLOSE}$. The first logic circuit 232 receives the logic high first voltage monitor signal $V_{VM1\_B\_HV}$ and the logic high first control signal $V_{CLOSE}$ and generates a logic high second control signal $V_{CLOSE\_HV}$. The logic high second control signal $V_{CLOSE\_HV}$ is inverted to a logic low safe-state signal $V_{CLOSE\_B\_LV}$ by the NMOS transistor 234. As the gate terminal of the power-switch 238 receives the logic low safe-state signal $V_{CLOSE\_B\_LV}$, the power-switch 238 is turned ON. The drain terminal of the power-switch 238 is pulled up to the first voltage level of the source terminal of the power-switch 238. Therefore, at time T3, the LV regulator 202 is connected to the low power domain 208 as the power-switch 238 starts conducting. Thus, the power-switch 238 is closed at time T3. Since the first regulated voltage $V_{LV}$ is less than the output voltage of the HV regulator 204, the intrinsic diode 216 is reverse-biased.

From time T3 to T4, the power-switch 238 remains closed and the first node voltage $V_A$ starts increasing to the first voltage level. At time T4, the first node voltage $V_A$ exceeds the second threshold voltage $V_2$. Therefore, the second comparator circuit 226 generates a logic high second voltage monitor signal $V_{VM2\_B\_HV}$. The logic high second voltage monitor signal $V_{VM2\_B\_HV}$ indicates that the reference signal $V_{CLOSE\_LV}$ generated by the low power domain 208 is valid and may be used to control the state of the power-switch 238. The low power domain 208 generates a logic high reference signal $V_{CLOSE\_LV}$ when the IC 200 operates in the HIGH power mode. The level-shifter 228 shifts the logic high reference signal $V_{CLOSE\_LV}$. The first logic gate 230 receives the level-shifted logic high reference signal $V_{CLOSE\_LV}$ and the logic high second voltage monitor signal $V_{VM2\_B\_HV}$ and generates a logic high first control signal $V_{CLOSE}$. The first logic circuit 232 receives the logic high first voltage monitor signal $V_{VM1\_B\_HV}$ and the logic high first control signal $V_{CLOSE}$ and generates a logic high second control signal $V_{CLOSE\_HV}$. The logic high second control signal $V_{CLOSE\_HV}$ is inverted by the NMOS transistor 234 to the logic low safe-state signal $V_{CLOSE\_B\_LV}$. As the gate terminal of the power-switch 238 receives the logic low safe-state signal $V_{CLOSE\_B\_LV}$, the power-switch 238 remains ON. The drain terminal of the power-switch 238 remains at the first voltage level of the source terminal of the power-switch 238. As shown in FIG. 3, from time T4 to T6, even though the voltage levels of the voltage regulated by the HV regulator 204, the first voltage monitor signal $V_{VM1\_B\_HV}$, the first node voltage $V_A$, the second voltage monitor signal $V_{VM2\_B\_HV}$, the reference signal $V_{CLOSE\_LV}$ the first control signal $V_{CLOSE}$, and the second control signal $V_{CLOSE\_LV}$ are changing, the logic states of these signals remain constant. Thus, the power-switch 238 remains ON and continues conducting. That is, the NMOS transistor 238 remains closed from time T4 to T6.

At time T6, the IC 200 begins operating in the LOW power mode and the LV regulator 202 is turned OFF. Thus, the output voltage of the LV regulator 202 drops to zero. Since the IC 200 is in the LOW power mode, the LP_LV regulator 206 is turned ON and provides the third regulated voltage $V_{LP\_LV}$ at the third voltage level to the low power domain 208. Therefore, after time T6, the first node voltage $V_A$ is at the third voltage level. Since the first node voltage $V_A$ exceeds the second threshold voltage $V_2$, the second comparator circuit 226 generates the logic high second voltage monitor signal $V_{VM2\_B\_HV}$. Since the IC 200 is in the LOW power mode, the low power domain 208 generates a logic low reference signal $V_{CLOSE\_LV}$. The level-shifter 228 shifts the logic low reference signal $V_{CLOSE\_LV}$. The first logic gate 230 receives the level-shifted logic low reference signal $V_{CLOSE\_LV}$ and the logic high second voltage monitor signal $V_{VM2\_B\_HV}$ and generates a logic low first control signal $V_{CLOSE}$. The first logic circuit 232 receives the logic high first voltage monitor signal $V_{VM1\_B\_HV}$ and the logic low first control signal $V_{CLOSE}$ and generates a logic low second control signal $V_{CLOSE\_HV}$. The gate terminal of the NMOS transistor 234 receives the logic low second control signal $V_{CLOSE\_HV}$. The NMOS transistor 234 is turned off and its drain terminal is pulled up to the selected voltage level $V_{MAX}$. The gate terminal of the power-switch 238 receives the logic high safe-state signal $V_{CLOSE\_B\_LV}$ which is at the selected voltage level $V_{MAX}$ and therefore, the power-switch 238 is turned OFF. Thus, when the IC 200 operates in the LOW power mode, the power-switch 238 is open and the high power domain 210 is disconnected from the low power domain 208 after time T6.

When the IC 200 transitions from the LOW power mode to the HIGH power mode, the LP_LV regulator 206 is turned off and the LV regulator 202 is turned ON. Since the IC 200 is in the HIGH power mode, the low power domain 208 generates a logic high reference signal $V_{CLOSE\_LV}$. Therefore, the first control signal $V_{CLOSE}$ is at logic high state. As a result, the second control signal $V_{CLOSE\_HV}$ is at logic high state, which is inverted to the logic low safe-state signal $V_{CLOSE\_B\_LV}$. The gate terminal of the power-switch 238 receives the logic low safe-state signal $V_{CLOSE\_B\_LV}$. Therefore, the power-switch 238 is turned ON (closed) and the high power domain 210 is connected to the low power domain 208. If the HV regulator 204 is turned OFF accidentally during power-up and the second regulated voltage $V_{HV}$ is unavailable, the first voltage monitor signal $V_{VM1\_B\_HV}$ and the second control signal $V_{CLOSE\_HV}$ are pulled down to ground level (logic low). The NMOS transistor 234 inverts the logic low second control signal $V_{CLOSE\_HV}$ to the logic high safe-state signal $V_{CLOSE\_B\_LV}$, which turns OFF the power-switch 238. Thus, if the HV regulator 204 is turned OFF, the power-switch 238 is open, which ensures that the power-switch is open when the IC 200 powers-up.

It will be understood by those of skill in the art that the switching module 212 is an exemplary embodiment and may be replaced with a suitable equivalent switching arrangement that is capable of connecting and disconnecting the LV regulator 202 from the low power domain 208. In an embodiment of the present invention, the first threshold voltage $V_1$ may be equal to the first voltage level.

It will be further understood by those of skill in the art that the same logical function may be performed by different arrangements of logic gates, or that logic circuits operate using either positive or negative logic signals. Therefore, variations in the arrangement of some of the logic gates described above should not be considered to depart from the scope of the present invention.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

The invention claimed is:

1. An integrated circuit operable in a low power mode and a high power mode, comprising:
   a low power domain;
   a high power domain;
   a first voltage regulator that regulates a voltage provided to the high and low power domains at a first voltage level when the integrated circuit is in the high power mode and is switched off when the integrated circuit is in the low power mode;
   a second voltage regulator that generates a voltage that is regulated at a second voltage level, and operates in both of the high and low power modes;
   a third voltage regulator, connected between the second voltage regulator and the low power domain, that receives the voltage regulated by the second voltage regulator and regulates a voltage provided to the low power domain at a third voltage level when the integrated circuit is in the low power mode and is switched off when the integrated circuit is in the high power mode; and
   a switching module, connected to the second voltage regulator, and between the first voltage regulator and the low power domain, that receives and compares the voltage regulated by the second voltage regulator with a first threshold voltage, and connects the first voltage regulator to the low power domain when the voltage regulated by the second voltage regulator is greater than the first threshold voltage.

2. The integrated circuit of claim 1, wherein the first threshold voltage is substantially equal to the first voltage level.

3. The integrated circuit of claim 1, wherein the first threshold voltage is marginally lower than the first voltage level.

4. The integrated circuit of claim 1, wherein the switching module comprises:
   a voltage monitor module, connected to the second voltage regulator, that receives and compares the voltage regulated by the second voltage regulator with the first threshold voltage, and generates a voltage monitor signal when the voltage regulated by the second voltage regulator is greater than the first threshold voltage;
   a safe-state module, connected to the voltage monitor module, that receives the voltage monitor signal, a first control signal and a selected voltage level, and generates a safe-state signal; and
   a power-switch module, connected to the safe-state module, and between the first voltage regulator and the low power domain, that connects the first voltage regulator to the low power domain based on the safe-state signal.

5. The integrated circuit of claim 4, wherein the voltage monitor module includes a first comparator that receives the first threshold voltage and the voltage regulated by the second voltage regulator, and generates the voltage monitor signal.

6. The integrated circuit of claim 4, wherein the safe-state module comprises:
   an AND gate that receives the voltage monitor signal and the first control signal, and generates a second control signal;
   an n-channel metal oxide semiconductor (NMOS) transistor having a source terminal connected to ground, a body terminal connected to the source terminal, a gate terminal connected to the AND gate for receiving the second control signal, and a drain terminal connected to the power-switch module, wherein the safe-state signal is generated at the drain terminal; and
   a pull-up resistor having a first terminal connected to the drain terminal of the NMOS transistor and a second terminal that receives the selected voltage level.

7. The integrated circuit of claim 4, wherein the power-switch module comprises:
   a first transistor having a source terminal connected to the first voltage regulator, a drain terminal connected to the low power domain, and a gate terminal connected to the safe-state module for receiving the safe-state signal therefrom, wherein the first transistor connects the first voltage regulator to the low power domain based on the safe-state signal; and
   a supply selector module, connected to the source and drain terminals of the first transistor, wherein the supply selector module selects and provides a higher one of the voltages between the source and drain terminals of the first transistor as the selected voltage level to the safe-state module and the body terminal of the first transistor.

8. The integrated circuit of claim 7, wherein the first transistor is a p-channel metal oxide semiconductor (PMOS) transistor.

9. An integrated circuit operable in a low power mode and a high power mode, comprising:
   a low power domain;
   a high power domain;
   a first voltage regulator that regulates a first voltage provided to the low power and high power domains at a first voltage level when the integrated circuit is in a high power mode and is switched off when the integrated circuit is a low power mode;

a second voltage regulator that generates a second voltage that is regulated at a second voltage level, and operates when the integrated circuit is in the high and low power modes;

a third voltage regulator, connected between the second voltage regulator and the low power domain, that receives the voltage regulated by the second voltage regulator and regulates a third voltage provided to the low power domain at a third voltage level when the integrated circuit is in the low power mode and is switched off when the integrated circuit is in the high power mode;

a voltage monitor module, connected to the second voltage regulator, that receives and compares the second voltage regulator with a threshold voltage, and generates a voltage monitor signal when the second voltage regulator exceeds the threshold voltage;

a safe-state module, connected to the voltage monitor module, that receives the voltage monitor signal, a first control signal and a selected voltage level, and generates a safe-state signal; and a power-switch module, connected to the safe-state module, and between the first voltage regulator and the low power domain, that connects the first voltage regulator to the low power domain based on the safe-state signal.

10. The integrated circuit of claim 9, wherein the threshold voltage is substantially equal to the first voltage level.

11. The integrated circuit of claim 9, wherein the threshold voltage is marginally lower than the first voltage level.

12. The integrated circuit of claim 9, wherein the voltage monitor module includes a comparator circuit that receives the threshold voltage and the second voltage regulator, and generates the voltage monitor signal.

13. The integrated circuit of claim 9, wherein the safe-state module comprises:
   an AND gate that receives the voltage monitor signal and the first control signal, and generates a second control signal; and
   an n-channel metal oxide semiconductor (NMOS) transistor having a source terminal connected to ground, a body terminal connected to the source terminal thereof, a gate terminal connected to the AND gate for receiving the second control signal, and a drain terminal connected to the power-switch module by way of a pull-up resistor for receiving the selected voltage level, wherein the safe-state signal is generated at the drain terminal of the NMOS transistor.

14. The integrated circuit of claim 9, wherein the power-switch module comprises:
   a first transistor having a source terminal connected to the first voltage regulator, a drain terminal connected to the low power domain, and a gate terminal connected to the safe-state module for receiving the safe-state signal therefrom, wherein the first transistor connects the first voltage regulator to the low power domain based on the safe-state signal; and
   a supply selector module, connected to the source and drain terminals of the first transistor, wherein the supply selector module selects and provides a higher one of the voltages between the source and drain terminals of the first transistor as the selected voltage level to the safe-state module and the body terminal of the first transistor.

15. The integrated circuit of claim 14, wherein the first transistor is a p-channel metal oxide semiconductor (PMOS) transistor.

16. An integrated circuit operable in a low power mode and a high power mode, comprising:
   a low power domain and a high power domain;
   a first voltage regulator, that regulates a voltage provided to the low power and high power domains at a first voltage level when the integrated circuit is in a high power mode and is switched off when the integrated circuit is in a low power mode;
   a second voltage regulator, that generates a voltage that is regulated at a second voltage level, and operates when the integrated circuit is in the high and low power modes;
   a third voltage regulator, connected between the second voltage regulator and the low power domain, that receives the voltage regulated by the second voltage regulator and regulates a voltage provided to the low power domain at a third voltage level when the integrated circuit is in the low power mode and is switched off when the integrated circuit is in the high power mode;
   a first comparator circuit, that receives a first threshold voltage and the voltage regulated by the second voltage regulator, and generates a first voltage monitor signal when the voltage regulated by the second voltage regulator exceeds the first threshold voltage;
   a second comparator circuit, that receives a second threshold voltage and a first node voltage obtained at a junction of the low power domain and the third voltage regulator, and generates a second voltage monitor signal when the first node voltage exceeds the second threshold voltage;
   a level-shifter circuit, connected to the low power domain, that receives a reference signal and level shifts a voltage level of the reference signal from the third voltage level to the second voltage level;
   a first logic gate, that receives the second voltage monitor signal and the level-shifted reference signal, and generates a first control signal;
   a first logic circuit, that receives the first voltage monitor signal and the first control signal, and generates a second control signal;
   an n-channel metal oxide semiconductor (NMOS) transistor, having a source terminal connected to ground, a body terminal connected to the source terminal thereof, a gate terminal connected to the first logic circuit that receives the second control signal, and a drain terminal that receives a selected voltage level, wherein the NMOS transistor generates a safe-state signal at the drain terminal thereof;
   a first transistor having a source terminal connected to the first voltage regulator, a drain terminal connected to the low power domain, and a gate terminal connected to the drain terminal of the NMOS transistor for receiving the safe-state signal therefrom, wherein the first transistor connects the first voltage regulator to the low power domain based on the safe-state signal; and
   a supply selector module, connected to the source and drain terminals of the first transistor, wherein the supply selector module selects and provides a higher one of the voltages between the source and drain terminals of the first transistor as the selected voltage to the gate of the NMOS transistor by way of a pull-up resistor and the body terminal of the first transistor.

17. The integrated circuit of claim 16, wherein the first transistor is a p-channel metal oxide semiconductor (PMOS) transistor.

18. The integrated circuit of claim 16, wherein the threshold voltage is substantially equal to the first voltage level.

19. The integrated circuit of claim 16, wherein the threshold voltage is marginally lower than the first voltage level.

20. The integrated circuit of claim 16, wherein the first logic circuit comprises an AND gate and the first logic gate comprises a NAND gate.

\* \* \* \* \*